US006900697B1

(12) United States Patent
Doyle et al.

(10) Patent No.: US 6,900,697 B1
(45) Date of Patent: May 31, 2005

(54) METHOD AND SYSTEM FOR PROVIDING POWER MANAGEMENT IN A RADIO FREQUENCY POWER AMPLIFIER BY DYNAMICALLY ADJUSTING SUPPLY AND BIAS CONDITIONS

(75) Inventors: James T. Doyle, Nederland, CO (US); Dragan Maksimovic, Boulder, CO (US); Yushan Li, Longmont, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/160,281

(22) Filed: May 31, 2002

(51) Int. Cl.$^7$ ................................................. H03F 3/04
(52) U.S. Cl. ........................................ 330/297; 330/296
(58) Field of Search ................................ 330/297, 296, 330/285, 207 P, 298; 455/572

(56) References Cited

U.S. PATENT DOCUMENTS

| | | | | |
|---|---|---|---|---|
| 6,148,220 A | * | 11/2000 | Sharp et al. | 455/572 |
| 6,624,702 B1 | * | 9/2003 | Dening | 330/297 |
| 6,630,867 B2 | * | 10/2003 | Canyon et al. | 330/297 |

* cited by examiner

*Primary Examiner*—Henry Choe

(57) ABSTRACT

A method for providing power management in a radio frequency power amplifier is provided. An input voltage is received. A digital power supply signal is generated. From the input voltage, a regulated power supply signal is generated based on the digital power supply signal.

17 Claims, 10 Drawing Sheets

METHOD AND SYSTEM FOR PROVIDING POWER MANAGEMENT IN A RADIO FREQUENCY POWER AMPLIFIER BY DYNAMICALLY ADJUSTING SUPPLY AND BIAS CONDITIONS

TECHNICAL FIELD OF THE INVENTION

The present invention relates generally to power amplifiers and, more particularly, to a method and system for providing power management in a radio frequency power amplifier by dynamically adjusting supply and bias conditions.

BACKGROUND OF THE INVENTION

Business and consumers use a wide array of wireless devices, including cell phones, wireless local area network (LAN) cards, global positioning system (GPS) devices, electronic organizers equipped with wireless modems, and the like. The increased demand for wireless communication, and other mobile, devices has created a corresponding demand for technical improvements to such devices. Generally speaking, more and more of the components of conventional radio receivers and transmitters are being fabricated in a single integrated circuit package.

One important aspect of wireless communication devices having integrated circuits is battery life. In order to maximize battery life for these wireless communication devices, much emphasis has been placed on minimizing power consumption in the integrated circuits of the wireless communication devices. One of the largest power consumers in a transmitter for a wireless communication device is the power amplifier. Thus, in order to minimize overall power consumption, a reduction in the power consumption of the power amplifier is often attempted.

Conventional approaches to minimizing power consumption in power amplifiers include envelope elimination and restoration (EER). This technique uses a high efficiency, non-linear power amplifier, such as a Class C power amplifier, instead of a low efficiency, linear power amplifier, such as a Class A power amplifier. However, if the power supply for the power amplifier is high frequency, such as 5 MHz or higher, instead of DC or low frequency, EER does not provide a workable solution.

Because many cellular telephone and other advanced signaling systems use higher order modulation with amplitude components in addition to phase components, linear power amplifiers are used in these systems. Thus, EER techniques may not be implemented to improve power amplifier efficiency in these systems. In addition, linear power amplifiers are generally even less efficient that non-linear power amplifiers. Therefore, a linear power amplifier efficiency improvement is needed that provides high bandwidth, in addition to high efficiency.

Discrete components, such as inductors and capacitors, of power amplifiers generally have to handle up to five times the desired tracking frequency for the power amplifier. However, typical discrete components are not specified for more than 1 MHz, and with pulse-width modulation techniques, the components need to handle up to 25 MHz for a 5 MHz tracking bandwidth. Thus, current technology does not provide components with the needed specifications to improve the efficiency of linear power amplifiers using conventional techniques.

SUMMARY OF THE INVENTION

In accordance with the present invention, a method and system for providing power management in a radio frequency power amplifier by dynamically adjusting supply and bias conditions are provided that substantially eliminate or reduce disadvantages and problems associated with conventional systems and methods. In particular, the efficiency of the power amplifier is improved by optimally and dynamically adjusting the power supply and the bias voltage for the power amplifier. According to one embodiment of the present invention, a method for providing power management in a radio frequency power amplifier is provided. An input voltage is received. A digital power supply signal is generated. From the input voltage, a regulated power supply signal is generated based on the digital power supply signal.

According to another embodiment of the present invention, another method for providing power management in a radio frequency power amplifier is provided. An input voltage is received. A first digital power supply signal is generated. A second digital power supply signal is generated. From the input voltage, a first regulated power supply signal is generated based on the first digital power supply signal. From the input voltage, a second regulated power supply signal is generated based on the second digital power supply signal.

According to yet another embodiment of the present invention, a system for providing power management in a radio frequency power amplifier is provided that includes a power amplifier and a power regulator. The power amplifier is operable to generate a radio frequency output signal based on a radio frequency input signal. The power regulator is coupled to the power amplifier. The power regulator is operable to receive an input voltage, to generate a digital power supply signal, to generate a digital bias signal, to generate from the input voltage a regulated power supply signal based on the digital power supply signal, to generate a bias signal based on the digital bias signal, and to provide the regulated power supply signal and the bias signal to the power amplifier. The power amplifier is also operable to generate the radio frequency output signal based on the regulated power supply signal and the bias signal.

Technical advantages of one or more embodiments of the present invention include providing an improved method for managing power consumption in mobile devices. In a particular embodiment, the power supply and the bias voltage for the power amplifier are optimally and dynamically adjusted. As a result, the efficiency of the power amplifier is improved based on operating conditions.

Other technical advantages will be readily apparent to one skilled in the art from the following figures, description, and claims.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1 through 13, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged power amplifier system.

Figure 1:
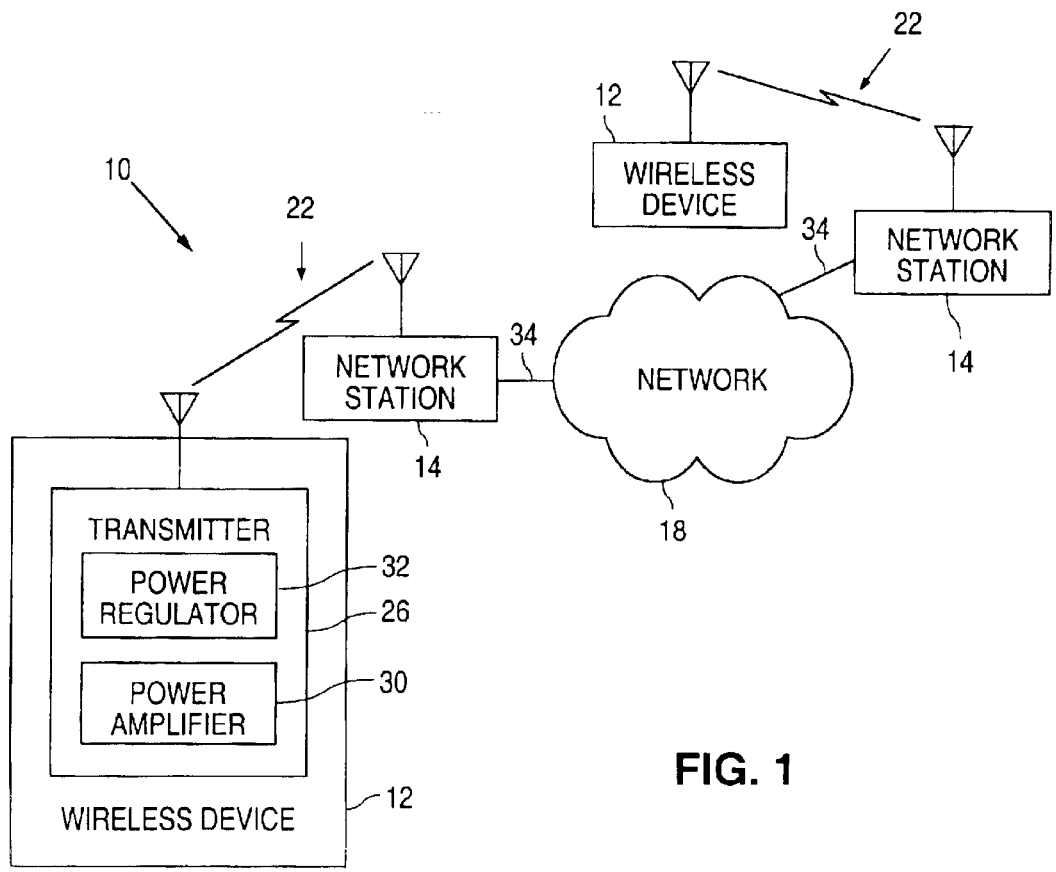
FIG. 1 is a block diagram illustrating a communication system operable to provide power management for a radio frequency power amplifier in accordance with one embodiment of the present invention.

FIG. 1 is a block diagram illustrating a communication system 10 operable to provide power management for a radio frequency power amplifier in accordance with one embodiment of the present invention. The communication system 10 comprises a plurality of wireless devices 12, a plurality of network stations 14 for providing communication for wireless devices 12 located in specified geographical areas, and a network 18 for providing communication between network stations 14 and other suitable communication system components, such as servers and the like, coupled to the network 18. Thus, it will be understood that the system 10 may comprise any other suitable components of a communication system, such as servers coupled to the network 18, without departing from the scope of the present invention.

Each wireless device 12 may comprise a cellular or other wireless telephone, a pager, a laptop computer, a personal digital assistant, or any other suitable type of wireless device operable to communicate wirelessly with the network 18 through a network station 14. As used herein, "each" means every one of at least a subset of the identified items.

Each wireless device 12 is operable to communicate with a network station 14 over a wireless interface 22. Thus, the wireless interface 22 is operable to transfer messages between a wireless device 12 and a network station 14. The wireless interface 22 may comprise communication channels defined upon radio links, such as an Enhanced Data for GSM (Global System for Mobile communications) Evolution interface, a Wideband Code Division Multiple Access interface, or any other suitable interface.

Each wireless device 12 comprises a transmitter 26, in addition to other suitable components to enable its operation that are not illustrated in FIG. 1. In accordance with the present invention, the transmitter 26 for at least one of the wireless devices 12 comprises a radio frequency power amplifier 30 and a power regulator 32. It will be understood that the transmitter 26 may also comprise any other suitable components for operation. The power amplifier 30 is operable to transmit a signal that includes data modulated onto a carrier such that the network station 14 may receive the signal over the wireless interface 22. The power regulator 32 is operable to regulate the power consumption of the power amplifier 30, as described in more detail below in connection with FIGS. 2–10.

Each network station 14 is operable to provide wireless devices 12 with access to voice and/or data networks by providing voice and/or data messages received from the wireless devices 12 to the network 18 and messages received from the network 18 to the wireless devices 12. According to one embodiment, the network stations 14 comprise base stations for a public land mobile network and the wireless devices 12 comprise wireless telephones.

In one embodiment, the network 18 comprises a packet data network, such as the Internet, or other suitable network. However, the network 18 may also comprise any interconnection found on any computer network such as a local area network (LAN), a wide area network (WAN), or any other communications and data exchange systems created by connecting two or more computers.

Each network station is operable to communicate with the network 18 over communication lines 34, which may be any type of communication link capable of supporting data transfer. In one embodiment, the communication lines 34 may comprise, alone or in combination, Integrated Services Digital Network (ISDN), Asymmetric Digital Subscriber Line (ADSL), T1 or T3 communication lines, hardwire lines, or telephone links. It will be understood that the communication lines 34 may comprise other suitable types of data communication links. The communication lines 34 may also connect to a plurality of intermediate servers between the network 18 and the network stations 14.

Figure 2A:
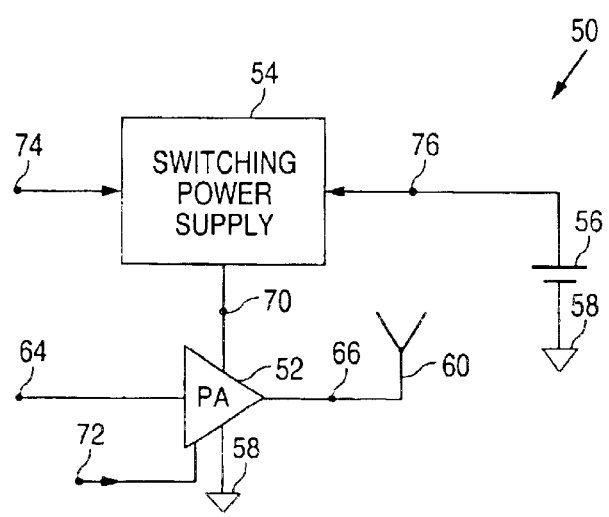
FIG. 2A is a block diagram illustrating the transmitter of FIG. 1 in accordance with one embodiment of the present invention.

FIG. 2A is a block diagram illustrating a transmitter 50 in accordance with one embodiment of the present invention. The transmitter 50 may be used as the transmitter 26 in the wireless device 12 of the communication system 10; however, it will be understood that the transmitter 50 may be implemented in any suitable component or system other than the communication system 10 without departing from the scope of the present invention.

The transmitter 50 comprises a power amplifier 52, a power regulator 54, and a power source 56. The power regulator 54 is coupled between the power source 56 and the power amplifier 52. The power amplifier 52 and the power source 56 are also coupled to ground 58.

The power amplifier 52 comprises a radio frequency power amplifier and is operable to generate a radio frequency signal that includes data modulated onto a carrier for transmission over a wireless interface, such as the wireless interface 22. According to one embodiment, the power amplifier 52 comprises a Class A amplifier. However, it will be understood that the power amplifier 52 may comprise any suitable type of power amplifier without departing from the scope of the present invention.

The power regulator 54 comprises a switching power supply and is operable to receive a specified voltage from the power source 56 and to provide a regulated power supply to the power amplifier 52 based on the voltage received from the power source 56.

According to one embodiment, the power source 56 comprises a battery operable to provide a voltage of between 2.7 and 5.5 volts. However, it will be understood that the power source 56 may provide any suitable voltage without departing from the scope of the present invention. The ground 58 is operable to provide any suitable potential less than the power source 56. According to one embodiment, the ground 58 is operable to provide a potential of approximately 0 volts.

The transmitter 50 also comprises an antenna 60 coupled to the power amplifier 52. The antenna 60 is operable to receive the radio frequency signal generated by the power amplifier 52 and to transmit the signal over the wireless interface.

In operation, the power amplifier 52 receives a radio frequency input signal 64 and generates a radio frequency output signal 66 based on the input signal 64. The output signal 66 is provided to the antenna 60 for transmission over the wireless interface. The power amplifier 52 operates based on a regulated power supply signal 70 generated by the power regulator 54.

In addition, the power amplifier 52 receives a bias signal 72. The bias signal 72 may be provided based on a look-up table or other suitable means in order to optimize the efficiency of the power amplifier 52 based on operating conditions.

The power regulator 54 receives a power control signal 74 and the input voltage 76 supplied by the power source 56. Based on the power control signal 74, the power regulator 54 generates the regulated power supply signal 70 for the power amplifier 52 from the input voltage 76. According to one embodiment, the power regulator 54 scales the regulated power supply signal 70 with the output power level of the output signal 66.

Figure 2B:
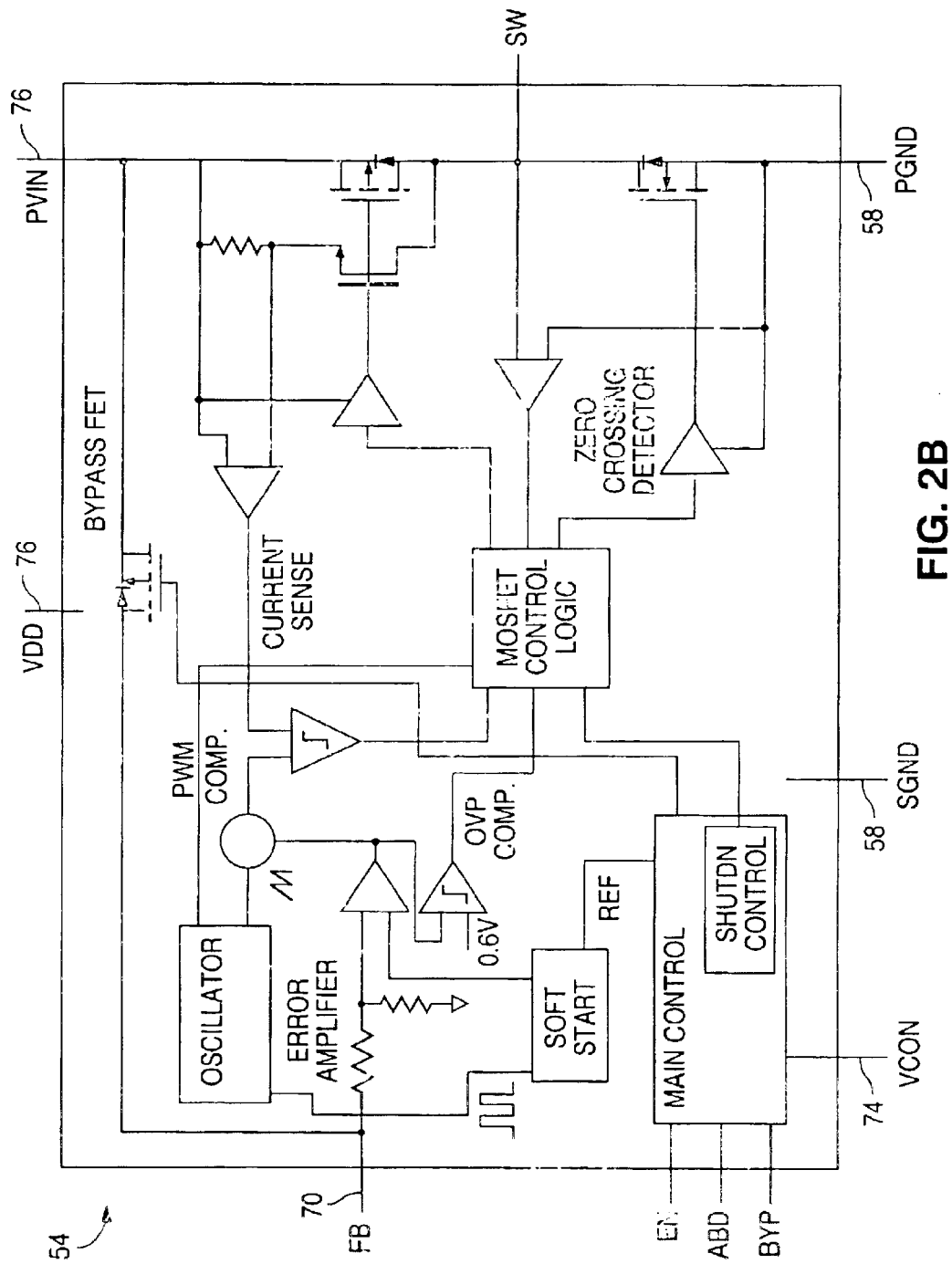
FIG. 2B is a block diagram illustrating the power to regulator of FIG. 2A in accordance with one embodiment of the present invention.

FIG. 2B is a block diagram illustrating the power regulator 54 in accordance with one embodiment of the present invention. It will be understood that the power regulator 54 may be otherwise suitably implemented without departing from the scope of the present invention.

The power regulator 54 comprises a switching power supply that is operable to receive the power control signal 74 and the input voltage 76 from the power source 56 and to generate the regulated power supply signal 70 for the power amplifier 52 based on those signals 74 and 76. The power regulator 54 comprises control logic, a controller including shutdown control, a soft start system, an oscillator, two comparators, an error amplifier, a current sensor, and a zero crossing detector, in addition to a plurality of other circuit components, such as resistors, transistors and inverters.

Figure 3:
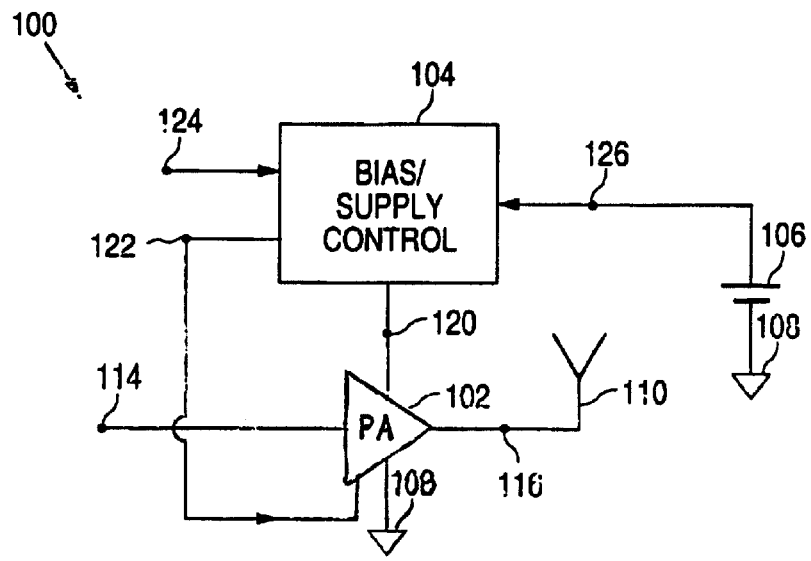
FIG. 3 is a block diagram illustrating the transmitter of FIG. 1 in accordance with a second embodiment of the present invention.

FIG. 3 is a block diagram illustrating a transmitter 100 in accordance with one embodiment of the present invention. The transmitter 100 may be used as the transmitter 26 in the wireless device 12 of the communication system 10; however, it will be understood that the transmitter 100 may be implemented in any suitable component or system other than the communication system 10 without departing from the scope of the present invention.

The transmitter 100 comprises a power amplifier 102, a power regulator 104, and a power source 106. The power regulator 104 is coupled between the power source 106 and the power amplifier 102. The power amplifier 102 and the power source 106 are also coupled to ground 108.

The power amplifier 102 comprises a radio frequency power amplifier and is operable to generate a radio frequency signal that includes data modulated onto a carrier for transmission over a wireless interface, such as the wireless interface 22. The power regulator 104 comprises an integrated bias/supply control and is operable to receive a specified voltage from the power source 106 and to provide a regulated power supply to the power amplifier 102 based on the voltage received from the power source 106.

According to one embodiment, the power source 106 comprises a battery operable to provide a voltage of between 2.7 and 5.5 volts. However, it will be understood that the power source 106 may provide any suitable voltage without departing from the scope of the present invention. The ground 108 is operable to provide any suitable potential less than the power source 106. According to one embodiment, the ground 108 is operable to provide a potential of approximately 0 volts.

The transmitter 100 also comprises an antenna 110 coupled to the power amplifier 102. The antenna 110 is operable to receive the radio frequency signal generated by the power amplifier 102 and to transmit the signal over the wireless interface.

In operation, the power amplifier 102 receives a radio frequency input signal 114 and generates a radio frequency output signal 116 based on the input signal 114. The output signal 116 is provided to the antenna 110 for transmission over the wireless interface. The power amplifier 102 operates based on a regulated power supply signal 120 generated by the power regulator 104.

In addition, the power amplifier 102 receives a bias signal 122 from the power regulator 104. The bias signal 122 may be provided based on a look-up table or other suitable means in order to optimize the efficiency of the power amplifier 102 based on operating conditions.

The power regulator 104 receives a power control signal 124 and the input voltage 126 supplied by the power source 106. Based on the power control signal 124, the power regulator 104 generates the regulated power supply signal 120 for the power amplifier 102 from the input voltage 126. According to one embodiment, the power regulator 104 optimizes the efficiency of the power amplifier 102 over a full range of output power levels for the output signal 116 in both GSM and WCDMA.

Figure 4:
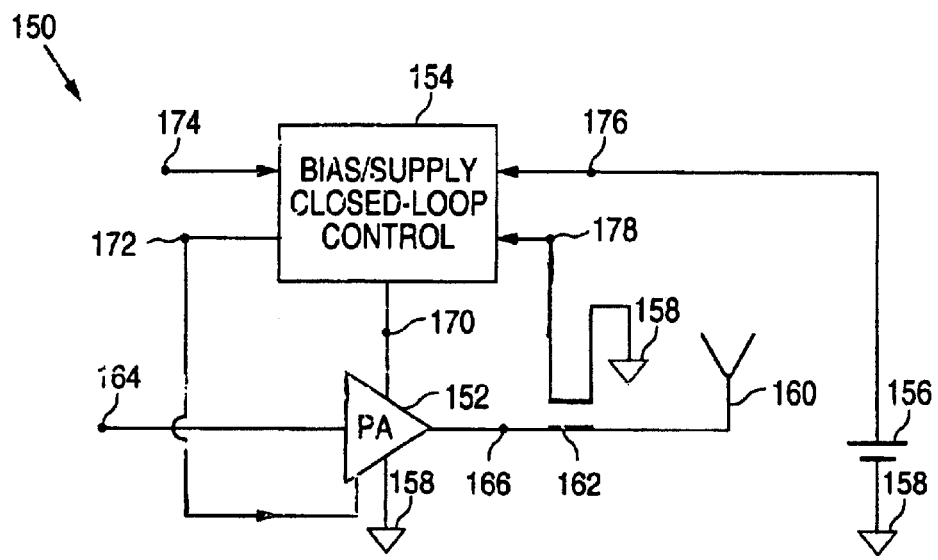
FIG. 4 is a block diagram illustrating the transmitter of FIG. 1 in accordance with a third embodiment of the present invention.

FIG. 4 is a block diagram illustrating a transmitter 150 in accordance with one embodiment of the present invention. The transmitter 150 may be used as the transmitter 26 in the wireless device 12 of the communication system 10; however, it will be understood that the transmitter 150 may be implemented in any suitable component or system other than the communication system 10 without departing from the scope of the present invention.

The transmitter 150 comprises a power amplifier 152, a power regulator 154, and a power source 156. The power regulator 154 is coupled between the power source 156 and the power amplifier 152. The power amplifier 152 and the power source 156 are also coupled to ground 158.

The power amplifier 152 comprises a radio frequency power amplifier and is operable to generate a radio frequency signal that includes data modulated onto a carrier for transmission over a wireless interface, such as the wireless interface 22. The power regulator 154 comprises an integrated bias/supply closed-loop control and is operable to receive a specified voltage from the power source 156 and to provide a regulated power supply to the power amplifier 152 based on the voltage received from the power source 156.

According to one embodiment, the power source 156 comprises a battery operable to provide a voltage of between 2.7 and 5.5 volts. However, it will be understood that the power source 156 may provide any suitable voltage without departing from the scope of the present invention. The ground 158 is operable to provide any suitable potential less than the power source 156. According to one embodiment, the ground 158 is operable to provide a potential of approximately 0 volts.

The transmitter 150 also comprises an antenna 160 coupled to the power amplifier 152 and a directional coupler 162. The antenna 160 is operable to receive the radio frequency signal generated by the power amplifier 152 and to transmit the signal over the wireless interface. The directional coupler 162 is operable to provide feedback from the power amplifier 52 to the power regulator 54.

In operation, the power amplifier 152 receives a radio frequency input signal 164 and generates a radio frequency output signal 166 based on the input signal 164. The output signal 166 is provided to the antenna 160 for transmission over the wireless interface. The power amplifier 152 operates based on a regulated power supply signal 170 generated by the power regulator 154.

In addition, the power amplifier 152 receives a bias signal 172 from the power regulator 154. The bias signal 172 may be provided based on a look-up table or other suitable means in order to optimize the efficiency of the power amplifier 152 based on operating conditions.

The power regulator 154 receives a power control signal 174, the input voltage 176 supplied by the power source 156, and a feedback signal 178 from the directional coupler 162. Based on the power control signal 174 and the feedback signal 178, the power regulator 154 generates the regulated power supply signal 170 for the power amplifier 152 from the input voltage 176. According to one embodiment, the power regulator 154 optimizes the efficiency of the power amplifier 152 over a full range of output power levels for the output signal 166 by providing precise closed-loop output power control through the use of the feedback signal 178.

Figure 5A:
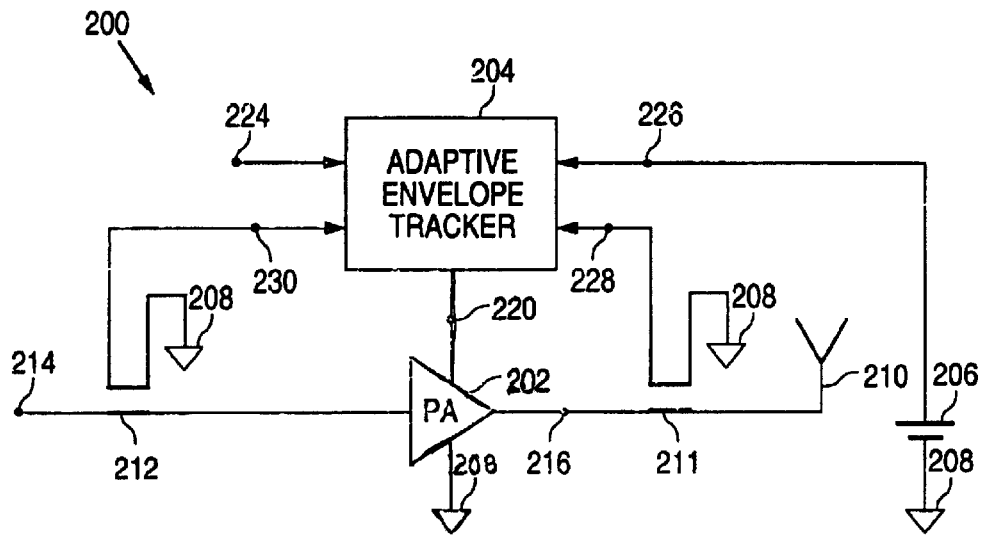
FIG. 5A is a block diagram illustrating the transmitter of FIG. 1 in accordance with a fourth embodiment of the present invention.

FIG. 5A is a block diagram illustrating a transmitter 200 in accordance with one embodiment of the present invention. The transmitter 200 may be used as the transmitter 26 in the wireless device 12 of the communication system 10; however, it will be understood that the transmitter 200 may be implemented in any suitable component or system other than the communication system 10 without-departing from the scope of the present invention.

The transmitter 200 comprises a power amplifier 202, a power regulator 204, and a power source 206. The power regulator 204 is coupled between the power source 206 and the power amplifier 202. The power amplifier 202 and the power source 206 are also coupled to ground 208.

The power amplifier 202 comprises a radio frequency power amplifier and is operable to generate a radio frequency signal that includes data modulated onto a carrier for transmission over a wireless interface, such as the wireless interface 22. According to one embodiment, the power amplifier 52 comprises a Class C, E or F amplifier. However, it will be understood that the power amplifier 52 may comprise any suitable type of power amplifier without departing from the scope of the present invention.

The power regulator 204 comprises an adaptive envelope tracker and is operable to receive a specified voltage from the power source 206 and to provide a regulated power supply to the power amplifier 202 based on the voltage received from the power source 206.

According to one embodiment, the power source 206 comprises a battery operable to provide a voltage of between 2.7 and 5.5 volts. However, it will be understood that the power source 206 may provide any suitable voltage without departing from the scope of the present invention. The ground 208 is operable to provide any suitable potential less than the power source 206. According to one embodiment, the ground 208 is operable to provide a potential of approximately 0 volts.

The transmitter 200 also comprises an antenna 210 coupled to the power amplifier 202 and first and second directional couplers 211 and 212. The antenna 210 is operable to receive the radio frequency signal generated by the power amplifier 202 and to transmit the signal over the wireless interface. The directional coupler 211 is operable to provide feedback from the power amplifier 52 to the power regulator 54, while the directional coupler 212 is operable to provide couple an input signal for the power amplifier 52 to the power regulator 54.

In operation, the power amplifier 202 receives a radio frequency input signal 214 and generates a radio frequency output signal 216 based on the input signal 214. The output signal 216 is provided to the antenna 210 for transmission over the wireless interface. The power amplifier 202 operates based on a regulated power supply signal 220 generated by the power regulator 204.

The power regulator 204 receives a power control signal 224, the input voltage 226 supplied by the power source 206, a feedback signal 228 from the directional coupler 211, and an amplifier input signal 230 from the directional coupler 212. Based on the power control signal 224, the feedback signal 228, and the amplifier input signal 230, the power regulator 204 generates the regulated power supply signal 220 for the power amplifier 202 from the input voltage 226. According to one embodiment, the power regulator 204 optimizes the efficiency of the power amplifier 202 over a full range of output power levels for the output signal 216 by tracking both low frequency, including DC, and high frequency, up to at least 5 MHz, input signals 214. According to one embodiment, the high frequency tracked may comprise about 1 MHz to about 5 MHz.

Figure 5B:
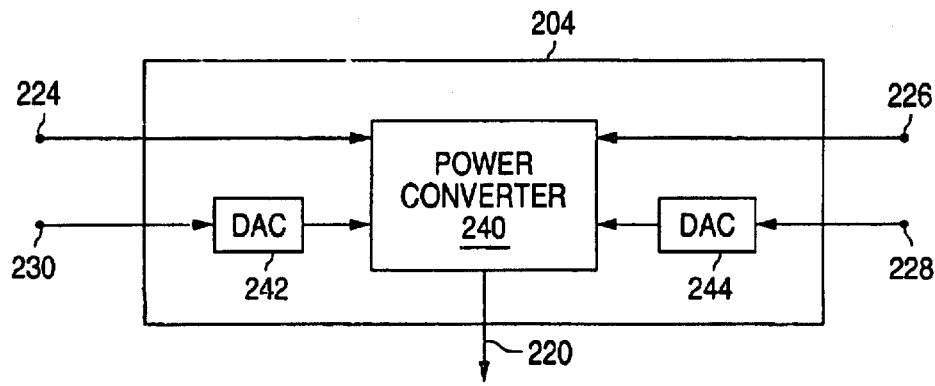
FIG. 5B is a block diagram illustrating the adaptive envelope tracker of FIG. 5A in accordance with one embodiment of the present invention.

FIG. 5B is a block diagram illustrating the adaptive envelope tracker 204 in accordance with one embodiment of the present invention. According to this embodiment, the adaptive envelope tracker 204 is operable to receive the power control signal 224 and the input voltage 226 supplied by the power source 206 and is also operable to receive digital signals for the feedback signal 228 the amplifier input signal 230.

The adaptive envelope tracker 204 comprises a power converter 240, a first digital-to-analog converter (DAC) 242, and a second digital-to-analog converter 244. The first digital-to-analog converter 242 is operable to receive the amplifier input signal 230 and to provide an analog amplifier input signal to the power converter 240. The second digital-to-analog converter 244 is operable to receive the feedback signal 228 and to provide an analog feedback signal to the power converter 240.

Using the input voltage 226, the power converter 240 is operable to generate the regulated power supply voltage 220 for the power amplifier 202 based on the power control signal 224, the analog feedback signal, and the analog amplifier input signal.

Figure 6:
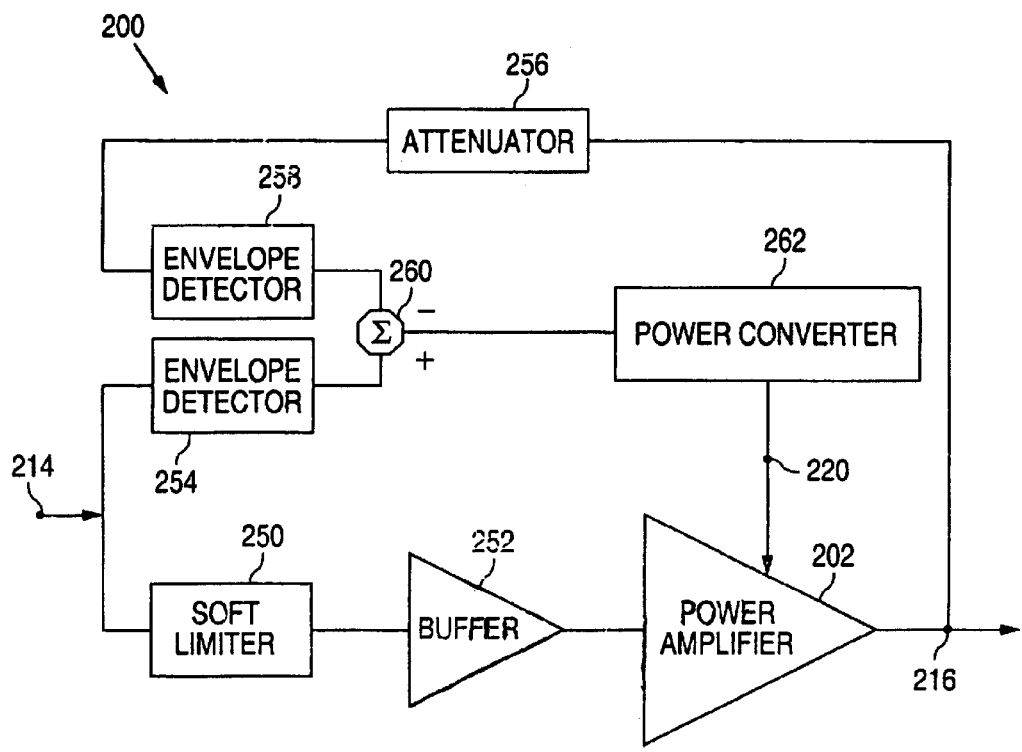
FIG. 6 is a block diagram illustrating details of the transmitter of FIG. 5 in accordance with one embodiment of the present invention.

FIG. 6 is a block diagram illustrating details of the transmitter 200 in accordance with one embodiment of the present invention. According to this embodiment, the transmitter 200 comprises a soft limiter 250, a buffer 252, a first envelope detector 254, an attenuator 256, a second envelope detector 258, a differencing node 260, and a power converter 262, in addition to the power amplifier 202.

The soft limiter 250 is operable to remove amplitude information from the input signal 214 and to provide the phase information to the buffer 252. The buffer 252 is operable to drive the power amplifier 202 with the phase information from the soft limiter 250.

The first envelope detector 254 is operable to remove the phase information from the input signal 214 and to provide the amplitude information to the differencing node 260. The attenuator 256 is operable to receive the output signal 216 and to attenuate the output signal 216 for the second envelope detector 258.

The second envelope detector 258 is operable to receive the attenuated output signal from the attenuator 256, to remove the phase information from the attenuated output signal and to provide the amplitude information to the differencing node 260.

The differencing node 260 is operable to compare the signals from the envelope detectors 254 and 258, which is essentially a comparison of the input signal 214 to the output signal 216, and to provide the difference to the power converter 262.

The power converter 262 is operable to receive the difference signal from the differencing node 260 and to adjust the regulated power supply signal 220 based on the difference signal in order to optimize the efficiency of the power amplifier 202. According to one embodiment, the power converter 262 comprises at least a 3 dB peak-to-average ratio and at least 5 MHz envelope tracking bandwidth.

Figure 7:
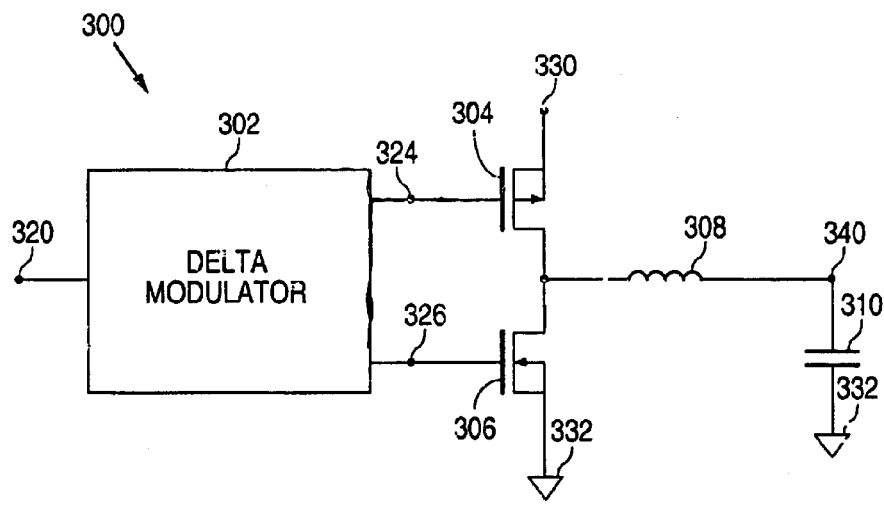
FIG. 7 is a block diagram illustrating the power regulator of FIG. 1 in accordance with a first embodiment of the present invention.

FIG. 7 is a block diagram illustrating a power regulator 300 in accordance with one embodiment of the present invention. The power regulator 300 may be used as the power regulator 32 in the wireless device 12 of the communication system 10; however, it will be understood that the power regulator 300 may be implemented in any suitable component or system other than the communication system 10 without departing from the scope of the present invention.

The power regulator 300 comprises a delta modulator 302, a first transistor 304, a second transistor 306, an inductor 308, and a capacitor 310. The delta modulator 302 is operable to receive a clock signal 320 and to generate a first output signal 324 and a second output signal 326 based on the clock signal 320. The clock signal 320 may comprise a variable switching frequency signal of at least 50 MHz or other suitable clock signal.

The first transistor 304 comprises a p-channel transistor, and the second transistor 306 comprises an n-channel transistor. The first transistor 304 has a source coupled to a power source 330, a drain coupled to a drain of the second transistor 306 and to the inductor 308, and a gate coupled to the delta modulator 302 and operable to receive the first output signal 324. The second transistor 306 has a source coupled to ground 332, a drain coupled to the drain of the first transistor 304 and to the inductor 308, and a gate coupled to the delta modulator 302 and operable to receive the second output signal 326.

The inductor 308 is coupled to the capacitor 310, which is coupled to ground 332. It will be understood that the inductor 308 and the capacitor 310 may comprise external components to the power regulator 300 without departing from the scope of the present invention.

In operation, the delta modulator 302 receives the clock signal 320 and generates the first and second output signals 324 and 326. The first output signal 324 is provided to the gate of the first transistor 304, and the second output signal 326 is provided to the gate of the second transistor 306. The signal at the drains of the transistors 304 and 306 is provided to the inductor and the capacitor 310. A regulated power supply signal 340 is generated by the power regulator 300 between the inductor 308 and the capacitor 310.

Figure 8:
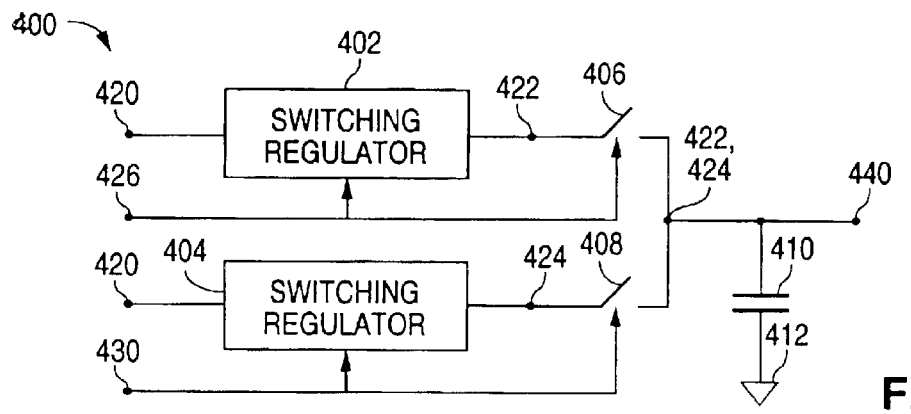
FIG. 8 is a block diagram illustrating the power regulator of FIG. 1 in accordance with a second embodiment of the present invention.

FIG. 8 is a block diagram illustrating a power regulator 400 in accordance with one embodiment of the present invention. The power regulator 400 may be used as the power regulator 32 in the wireless device 12 of the communication system 10; however, it will be understood that the power regulator 400 may be implemented in any suitable component or system other than the communication system 10 without departing from the scope of the present invention.

The power regulator 400 comprises a first switching regulator 402, a second switching regulator 404, a first switch 406, a second switch 408, and a capacitor 410 which is coupled to ground 412. The switching regulators 402 and 404 may comprise pulse-width-modulating buck enable devices or other suitable switching regulators.

The first and second switching regulators 402 and 404 are operable to receive a switching signal 420 and to generate first and second output signals 422 and 424, respectively. According to one embodiment, the switching signal 420 comprises a 1 MHz switching signal; however, it will be understood that the switching signal 420 may comprise any other suitable switching signal without departing from the scope of the present invention.

The first switching regulator 402 and the first switch 406 are operable to receive a select signal 426, which is operable to select the first switching regulator 402 by closing the first switch 406. In this situation, the first output signal 422 is provided by the power regulator 400 as the regulated power supply signal 440.

The second switching regulator 404 and the second switch 408 are operable to receive a select signal 430, which is operable to select the second switching regulator 404 by closing the second switch 408. In this situation, the second output signal 424 is provided by the power regulator 400 as the regulated power supply signal 440.

Figure 9:
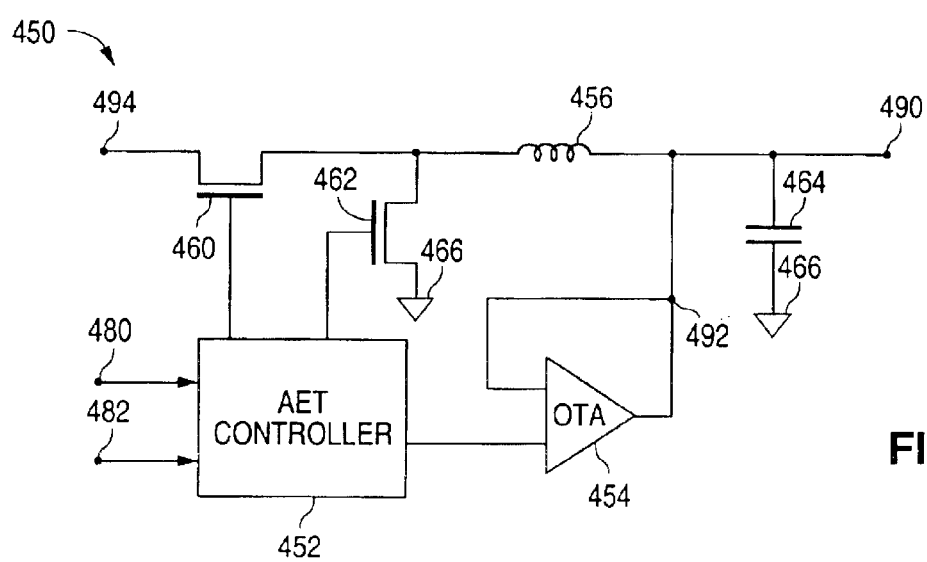
FIG. 9 is a block diagram illustrating the power regulator of FIG. 1 in accordance with a third embodiment of the present invention.

FIG. 9 is a block diagram illustrating a power regulator 450 in accordance with one embodiment of the present invention. The power regulator 450 may be used as the power regulator 32 in the wireless device 12 of the communication system 10; however, it will be understood that the power regulator 450 may be implemented in any suitable component or system other than the communication system 10 without departing from the scope of the present invention.

The power regulator 450 comprises an adaptive envelope tracking (AET) controller 452, an operational transconductance amplifier (OTA) 454, a synchronous buck 456, a first transistor 460, a second transistor 462, and a capacitor 464 which is coupled to ground 466.

The AET controller 452 is operable to receive a power control signal 480 and an envelope signal 482 and to generate an output signal for the OTA 454, in addition to signals for the transistors 460 and 462. The OTA 454 is operable to receive the output signal from the AET controller 452 and to generate a regulated power supply signal 490 based on the output signal from the AET controller 452 and a feedback signal 492.

In operation, the AET controller 452 receives the power control signal 480 and the envelope signal 482 and generates signals for the first transistor 460 and the second transistor 462 and an output signal for the OTA 454. The first and second transistors 460 and 462 receive the signals from the AET controller 452 and, based on those signals and a power source signal 494, generate a signal at the synchronous buck 456. The OTA 454 generates the regulated power supply signal 490 based on the output signal from the AET controller 452 and the feedback signal 492.

Figure 10:
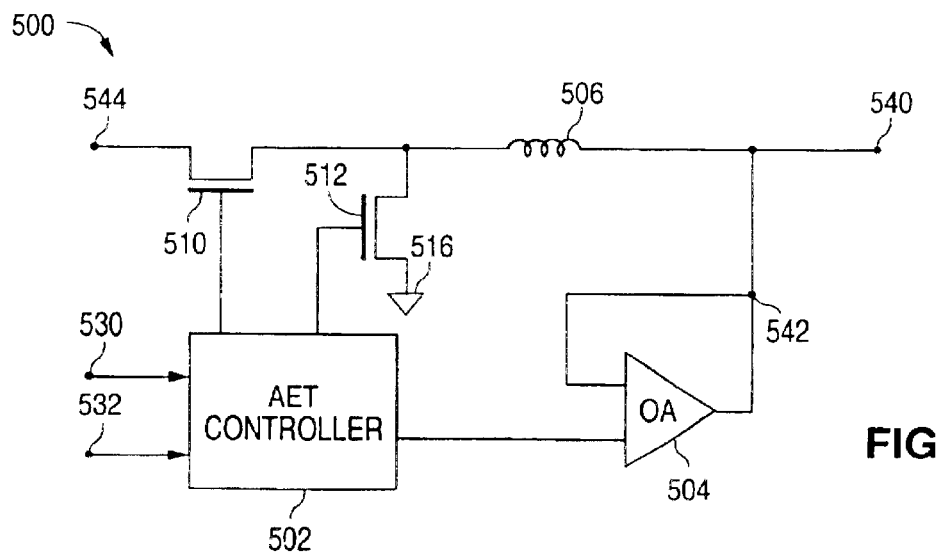
FIG. 10 is a block diagram illustrating the power regulator of FIG. 1 in accordance with a fourth embodiment of the present invention.

FIG. 10 is a block diagram illustrating a power regulator 500 in accordance with one embodiment of the present invention. The power regulator 500 may be used as the power regulator 32 in the wireless device 12 of the communication system 10; however, it will be understood that the power regulator 500 may be implemented in any suitable component or system other than the communication system 10 without departing from the scope of the present invention.

The power regulator 500 comprises an adaptive envelope tracking (AET) controller 502, an operational amplifier (OA) 504, a synchronous buck 506, a first transistor 510, and a second transistor 512 which is coupled to ground 516.

The AET controller 502 is operable to receive a power control signal 530 and an envelope signal 532 and to generate an output signal for the operational amplifier 504, in addition to signals for the transistors 510 and 512. The operational amplifier 504 is operable to receive the output signal from the AET controller 502 and to generate a regulated power supply signal 540 based on the output signal from the AET controller 502 and a feedback signal 542.

In operation, the AET controller 502 receives the power control signal 530 and the envelope signal 532 and generates signals for the first transistor 510 and the second transistor 512 and an output signal for the operational amplifier 504. The first and second transistors 510 and 512 receive the signals from the AET controller 502 and, based on those signals and a power source signal 544, generate a signal at the synchronous buck 506. The operational amplifier 504 generates the regulated power supply signal 540 based on the output signal from the AET controller 502 and the feedback signal 542. In this way, low frequency responses may be provided by a switching regulator, while high frequency responses are provided by a linear amplifier to optimize efficiency over a full range of output power levels.

Figure 11A:
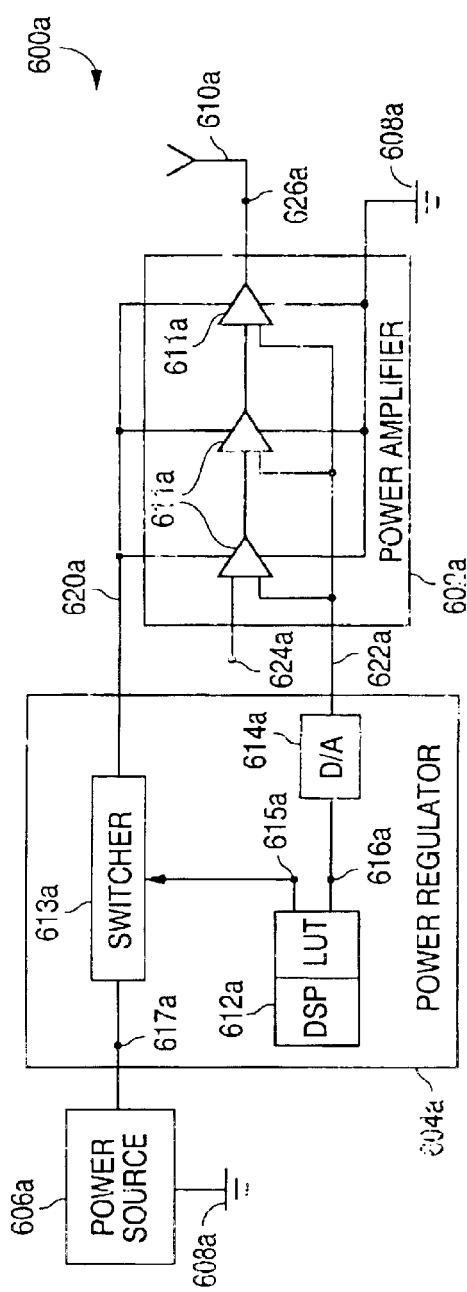
FIGS. 11A–B are block diagrams illustrating alternate embodiments of the transmitter of FIG. 1 in accordance with a fifth embodiment of the present invention.
Figure 11B:
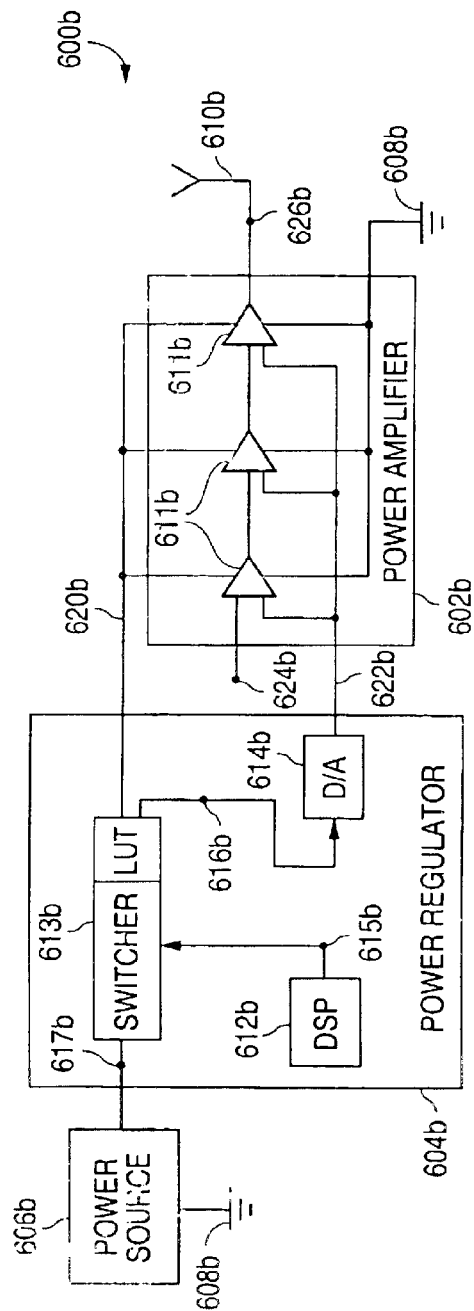

FIGS. 11A–B are block diagrams illustrating alternate embodiments of a transmitter 600 in accordance with one embodiment of the present invention. The transmitter 600 may be used as the transmitter 26 in the wireless device 12 of the communication system 10; however, it will be understood that the transmitter 600 may be implemented in any suitable component or system other than the communication system 10 without departing from the scope of the present invention.

The transmitter 600 comprises a power amplifier 602, a power regulator 604, and a power source 606. The power regulator 604 is coupled between the power source 606 and the power amplifier 602. The power amplifier 602 and the power source 606 are also coupled to ground 608.

The power amplifier 602 comprises a radio frequency power amplifier and is operable to generate a radio frequency signal that includes data modulated onto a carrier for transmission over a wireless interface, such as the wireless interface 22. The power regulator 604 comprises a single bias/supply control and is operable to receive a specified voltage from the power source 606 and to provide a regulated power supply to the power amplifier 602 based on the voltage received from the power source 606.

According to one embodiment, the power source 606 comprises a battery operable to provide a voltage of between 2.7 and 5.5 volts. However, it will be understood that the power source 606 may provide any suitable voltage without departing from the scope of the present invention. The ground 608 is operable to provide any suitable potential less than the power source 606. According to one embodiment, the ground 608 is operable to provide a potential of approximately 0 volts.

The transmitter 600 also comprises an antenna 610 coupled to the power amplifier 602. The antenna 610 is operable to is receive the radio frequency signal generated by the power amplifier 602 and to transmit the signal over the wireless interface.

According to the illustrated embodiment, the power amplifier 602 comprises a plurality of operational amplifiers 611, and the power regulator 604 comprises a baseband digital signal processor (DSP) 612, a switcher 613, and a digital-to-analog converter 614. In an alternative embodiment, the baseband DSP 612 may comprise a microcontroller EEPROM. The illustrated power amplifier 602 comprises three operational amplifiers 611; however, it will be understood that the power amplifier 602 may comprise any suitable number of operational amplifiers 611 without departing from the scope of the present invention.

According to the embodiment illustrated in FIG. 11A, the baseband DSP 612a comprises a look-up table that is operable to store optimal output power levels versus bias/supply conditions. The baseband DSP 612a is operable to provide a digital power supply signal 615a to the switcher 613a and a digital bias signal 616a to the digital-to-analog converter 614a. The switcher 613a may comprise a DC/DC switcher and is operable to receive an input voltage 617a from the power source 606a and the digital power supply signal 615a from the baseband DSP 612a. The switcher 613a is also operable to generate a regulated power supply signal 620a for the power amplifier 602a based on the input voltage 617a and the digital power supply signal 615a. The digital-to-analog converter 614a is operable to receive the digital bias signal 616a from the baseband DSP 612a and to generate a bias signal 622a for the power amplifier 602a based on the digital bias signal 616a.

According to the embodiment illustrated in FIG. 11B, the baseband DSP 612b is operable to provide a digital power supply signal 615b to the switcher 613b. The switcher 613b may comprise a DC/DC switcher and a look-up table that is operable to store optimal output power levels versus bias/supply conditions. The switcher 613b is operable to receive an input voltage 617b from the power source 606b and the digital power supply signal 615b from the baseband DSP 612b. The switcher 613b is also operable to generate a digital bias signal 616b for the digital-to-analog converter 614b and, based on the input voltage 617b and the digital power supply signal 615b, a regulated power supply signal 620b for the power amplifier 602b. The digital-to-analog converter 614b is operable to receive the digital bias signal 616b from the switcher 613b and to generate a bias signal 622b for the power amplifier 602b based on the digital bias signal 616b.

The power amplifier 602 is operable to receive the regulated power supply signal 620, the bias signal 622, and the radio frequency input signal 624 and to generate the radio frequency output signal 626 based on those signals 620, 622 and 624. According to one embodiment, the radio frequency input signal 624 comprises a signal as low as DC up to as high as at least 5 MHz.

In operation, the power amplifier 602 receives a radio frequency input signal 624 and generates a radio frequency output signal 626 based on the input signal 624. The output signal 626 is provided to the antenna 610 for transmission over the wireless interface. The power amplifier 602 operates based on the regulated power supply signal 620 generated by the power regulator 604.

In addition, the power amplifier 602 receives the bias signal 622 from the power regulator 604. The bias signal 622 allows the efficiency of the power amplifier 602 to be optimized based on operating conditions.

The power regulator 604 receives the input voltage 617 supplied by the power source 606. The power regulator 604 generates the regulated power supply signal 620 for the power amplifier 602 from the input voltage 617. According to one embodiment, the power regulator 604 optimizes the efficiency of the power amplifier 602 over a full range of output power levels for the output signal 626 by providing bias/supply control through the use of the regulated power supply signal 620 and the bias signal 622.

In this way, the supply and bias conditions can be set dynamically for a given output power level in accordance with the implemented power amplifier 602.

Figure 12A:
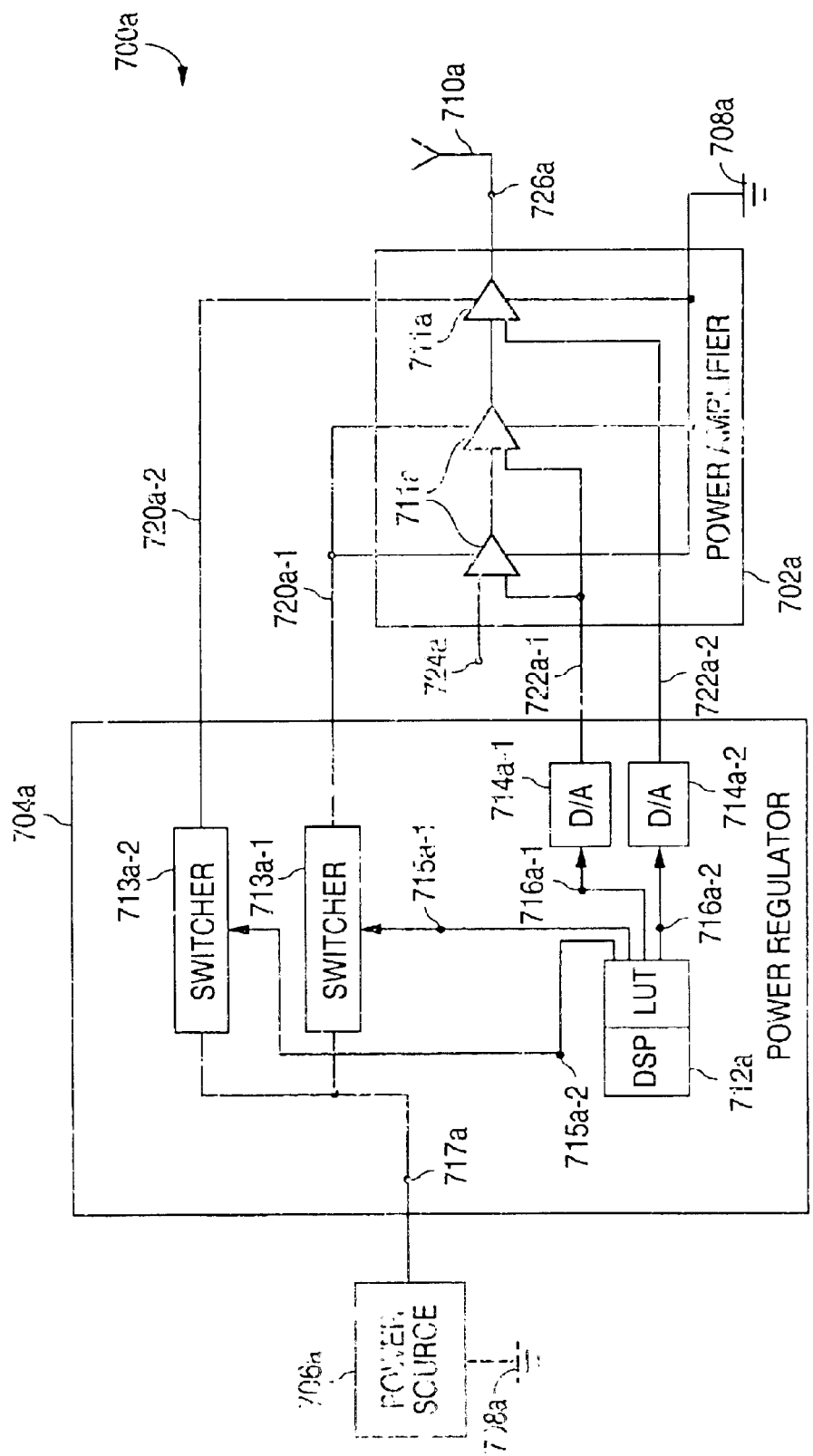
FIGS. 12A–B are block diagrams illustrating alternate embodiments of the transmitter of FIG. 1 in accordance with a sixth embodiment of the present invention.
Figure 12B:
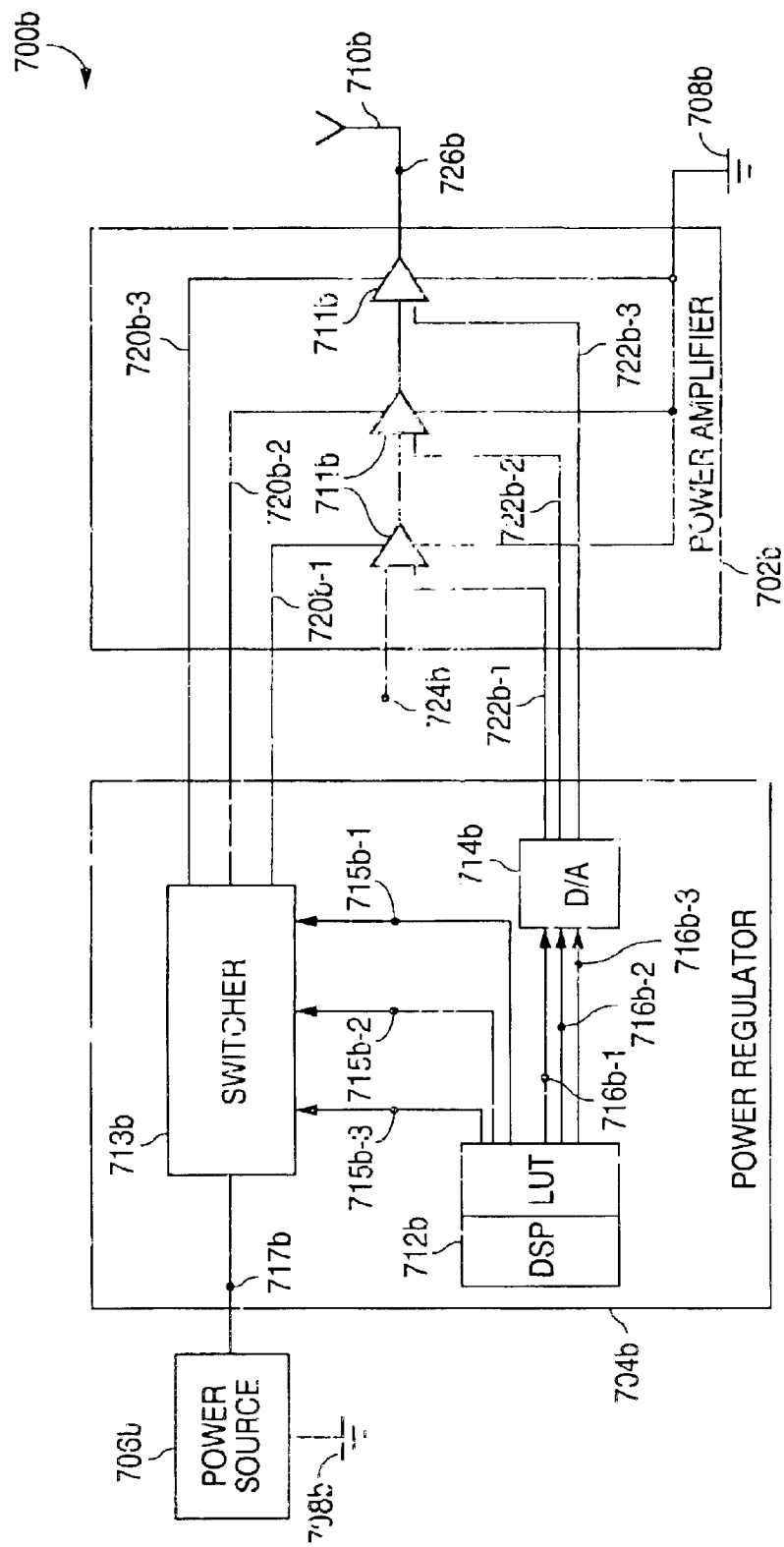

FIGS. 12A–B are block diagrams illustrating alternate embodiments of a transmitter 700 in accordance with one embodiment of the present invention. The transmitter 700 may be used as the transmitter 26 in the wireless device 12 of the communication system 10; however, it will be understood that the transmitter 700 may be implemented in any suitable component or system other than the communication system 10 without departing from the scope of the present invention.

The transmitter 700 comprises a power amplifier 702, a power regulator 704, and a power source 706. The power regulator 704 is coupled between the power source 706 and the power amplifier 702. The power amplifier 702 and the power source 706 are also coupled to ground 708.

The power amplifier 702 comprises a radio frequency power amplifier and is operable to generate a radio frequency signal that includes data modulated onto a carrier for transmission over a wireless interface, such as the wireless interface 22. The power regulator 704 comprises a multiple bias/supply control and is operable to receive a specified voltage from the power source 706 and to provide a regulated power supply to the power amplifier 702 based on the voltage received from the power source 706.

According to one embodiment, the power source 706 comprises a battery operable to provide a voltage of between 2.7 and 5.5 volts. However, it will be understood that the power source 706 may provide any suitable voltage without departing from the scope of the present invention. The ground 708 is operable to provide any suitable potential less than the power source 706. According to one embodiment, the ground 708 is operable to provide a potential of approximately 0 volts.

The transmitter 700 also comprises an antenna 710 coupled to the power amplifier 702. The antenna 710 is operable to receive the radio frequency signal generated by the power amplifier 702 and to transmit the signal over the wireless interface.

According to the illustrated embodiment, the power amplifier 702 comprises a plurality of operational amplifiers 711, and the power regulator 704 comprises a baseband digital signal processor (DSP) 712, a switcher 713, and a digital-to-analog converter 714. In an alternative embodiment, the baseband DSP 612 may comprise a microcontroller EEPROM. The illustrated power amplifier 702 comprises three operational amplifiers 711; however, it will be understood that the power amplifier 702 may comprise any suitable number of operational amplifiers 711 without departing from the scope of the present invention. The baseband DSP 712 comprises a look-up table that is operable to store optimal output power levels versus bias/supply conditions.

According to the embodiment illustrated in FIG. 12A, the switcher 713a comprises a pair of switchers 713a-1 and 713a-2, and the digital-to-analog converter 714a comprises a pair of digital-to-analog converters 714a-1 and 714a-2. It will be understood that the switcher 713a may comprise any suitable number of switchers and the digital-to-analog converter 714a may comprise any suitable number of digital-to-analog converters without departing from the scope of the present invention. The baseband DSP 712a is operable to provide a digital power supply signal 715a to each switcher 713a and a digital bias signal 716a to each digital-to-analog converter 714a.

The switchers 713a may comprise DC/DC switchers and are each operable to receive an input voltage 717a from the power is source 706a and a digital power supply signal 715a from the baseband DSP 712a. Each switcher 713a is also operable to generate a regulated power supply signal 720a for the power amplifier 702a based on the input voltage 717a and the digital power supply signal 715a. According to the illustrated embodiment, the switcher 713a-1 is operable to generate a regulated power supply signal 720a-1 for two of the operational amplifiers 711a of the power amplifier 702a, while the switcher 713a-2 is operable to generate a regulated power supply signal 720a-2 for the third operational amplifier 711a of the power amplifier 702a.

Each digital-to-analog converter 714a is operable to receive a digital bias signal 716a from the baseband DSP 712a and to generate a bias signal 722a for the power amplifier 702a based on the digital bias signal 716a. According to the illustrated embodiment, the digital-to-analog converter 714a-1 is operable to generate a bias signal 722a-1 for two of the operational amplifiers 711a of the power amplifier 702a, while the digital-to-analog converter 714a-2 is operable to generate a bias signal 722a-2 for the third operational amplifier 711a of the power amplifier 702a.

According to the embodiment illustrated in FIG. 12B, the baseband DSP 712b is operable to provide a plurality of digital power supply signals 715b to the switcher 713b and a plurality of digital bias signals 716b to the digital-to-analog converter 714b. The switcher 713b may comprise a DC/DC switcher and is operable to receive an input voltage 717b from the power source 706b and the digital power supply signals 715b from the baseband DSP 712b. The switcher 713b is also operable to generate a plurality of regulated power supply signals 720b for the power amplifier 702b based on the input voltage 717b and the digital power supply signals 715b.

According to the illustrated embodiment, the switcher 713b is operable to generate a first regulated power supply signal 720b-1 for a first one of the operational amplifiers 711b of the power amplifier 702b, a second regulated power supply signal 720b-2 for a second one of the operational amplifiers 711b of the power amplifier 702b, and a third regulated power supply signal 720b-3 for a third one of the operational amplifiers 711b of the power amplifier 702b.

The digital-to-analog converter 714b is operable to receive the digital bias signals 716b from the baseband DSP 712b and to generate a plurality of bias signals 722b for the power amplifier 702b based on the digital bias signals 716b. According to one embodiment, the digital-to-analog converter 714b is operable to generate the different bias signals 722b using time-interleaving. According to the illustrated embodiment, the digital-to-analog converter 714b is operable to generate a first bias signal 722b-1 for a first one of the operational amplifiers 711b of the power amplifier 702b, a second bias signal 722b-2 for a second one of the operational amplifiers 711b of the power amplifier 702b, and a third bias signal 722b-3 for a third one of the operational amplifiers 711b of the power amplifier 702b.

The power amplifier 702 is operable to receive the regulated power supply signals 720, the bias signals 722, and the radio frequency input signal 724 and to generate the radio frequency output signal 726 based on those signals 720, 722 and 724. According to one embodiment, the radio frequency input signal 724 comprises a signal as low as DC up to as high as at least 5 MHz.

In operation, the power amplifier 702 receives a radio frequency input signal 724 and generates a radio frequency output signal 726 based on the input signal 724. The output signal 726 is provided to the antenna 710 for transmission over the wireless interface. The power amplifier 702 operates based on the regulated power supply signals 720 generated by the power regulator 704.

In addition, the power amplifier 702 receives the bias signals 722 from the power regulator 704. The bias signals 722 allow the efficiency of the power amplifier 702 to be optimized based on operating conditions.

The power regulator 704 receives the input voltage 717 supplied by the power source 706. The power regulator 704 generates the regulated power supply signals 720 for the power amplifier 702 from the input voltage 717. According to one embodiment, the power regulator 704 optimizes the efficiency of the power amplifier 702 over a full range of output power levels for the output signal 726 by providing bias/supply control through the use of multiple regulated power supply signals 720 and multiple bias signals 722.

In this way, the final operational amplifier 711 of the power amplifier 702 may operate with a different regulated power supply signal 720 and a different bias signal 722 in order to give the final operational amplifier 711 more flexibility and dynamic supply range. As a result, the efficiency of the final operational amplifier 711, which handles the most power delivery and consumes the most power, may be improved. Thus, the power amplifier 702 is made more efficient overall.

Figure 13:
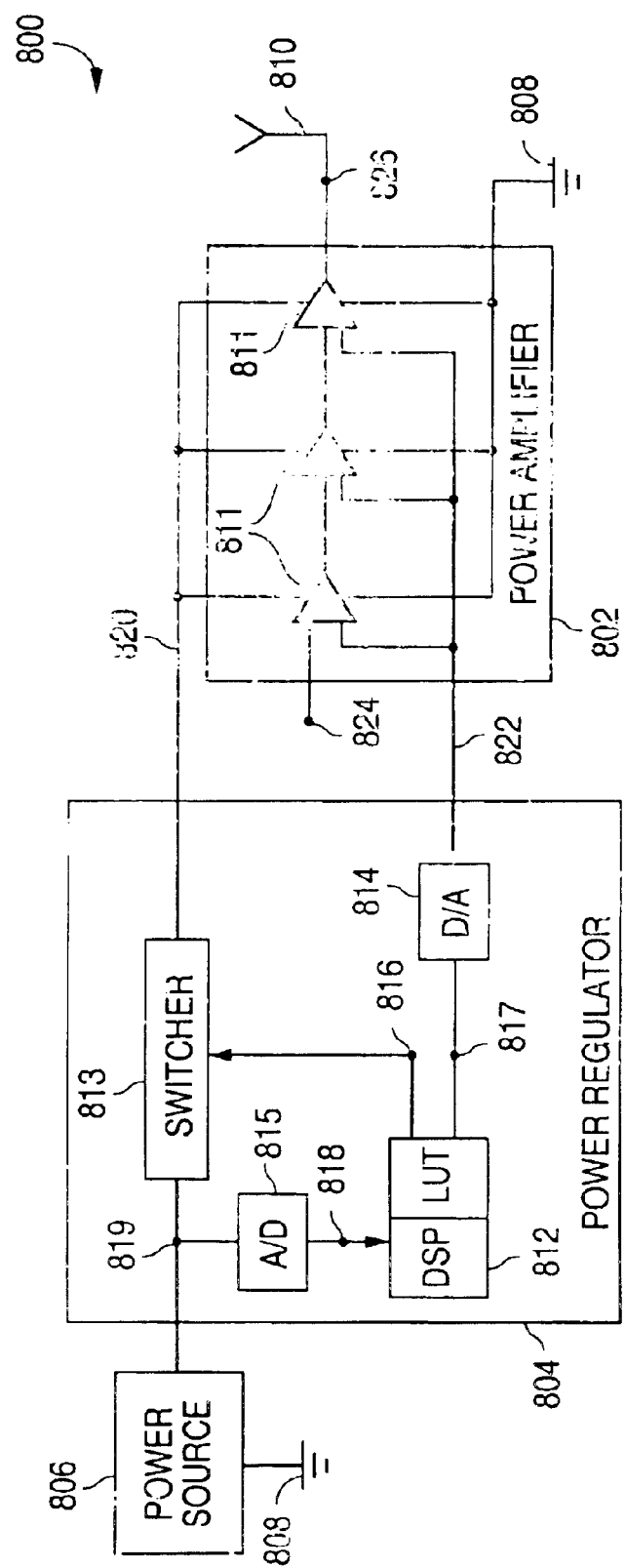
FIG. 13 is a block diagram illustrating the transmitter of FIG. 1 in accordance with a seventh embodiment of the present invention.

FIG. 13 is a block diagram illustrating a transmitter 800 in accordance with one embodiment of the present invention. The transmitter 800 may be used as the transmitter 26 in the wireless device 12 of the communication system 10; however, it will be understood that the transmitter 800 may be implemented in any suitable component or system other than the communication system 10 without departing from the scope of the present invention.

The transmitter 800 comprises a power amplifier 802, a power regulator 804, and a power source 806. The power regulator 804 is coupled between the power source 806 and the power amplifier 802. The power amplifier 802 and the power source 806 are also coupled to ground 808.

The power amplifier 802 comprises a radio frequency power amplifier and is operable to generate a radio frequency signal that includes data modulated onto a carrier for transmission over a wireless interface, such as the wireless interface 22. The power regulator 804 comprises a single bias/supply control and is operable to receive a specified voltage from the power source 806 and to provide a regulated power supply to the power amplifier 802 based on the voltage received from the power source 806.

According to one embodiment, the power source 806 comprises a battery operable to provide a voltage of between 2.7 and 5.5 volts. However, it will be understood that the power source 806 may provide any suitable voltage without departing from the scope of the present invention. The ground 808 is operable to provide any suitable potential less than the power source 806. According to one embodiment, the ground 808 is operable to provide a potential of approximately 0 volts.

The transmitter 800 also comprises an antenna 810 coupled to the power amplifier 802. The antenna 810 is operable to receive the radio frequency signal generated by the power amplifier 802 and to transmit the signal over the wireless interface.

According to the illustrated embodiment, the power amplifier 802 comprises a plurality of operational amplifiers 811, and the power regulator 804 comprises a baseband digital signal processor (DSP) 812, a switcher 813, a digital-to-analog converter 814, and an analog-to-digital converter 815. The illustrated power amplifier 802 comprises three operational amplifiers 811; however, it will be understood that the power amplifier 802 may comprise any suitable number of operational amplifiers 811 without departing from the scope of the present invention.

The baseband DSP 812 comprises a look-up table and is operable to provide a digital power supply signal 816 to the is switcher 813, a digital bias signal 817 to the digital-to-analog converter 814. The baseband DSP 812 is also operable to receive an analog signal 818 from the analog-to-digital converter 815. The analog-to-digital converter 815 is operable to receive an input voltage 819 from the power source 806 and to generate the analog signal 818 for the baseband DSP 812.

The switcher 813 may comprise a DC/DC switcher and is operable to receive the input voltage 819 from the power source 806 and the digital power supply signal 816 from the baseband DSP 812. The switcher 813 is also operable to generate a regulated power supply signal 820 for the power amplifier 802 based on the input voltage 819 and the digital power supply signal 816. The digital-to-analog converter 814 is operable to receive the digital bias signal 817 from the baseband DSP 812 and to generate a bias signal 822 for the power amplifier 802 based on the digital bias signal 817.

The power amplifier 802 is operable to receive the regulated power supply signal 820, the bias signal 822, and the radio frequency input signal 824 and to generate the radio frequency output signal 826 based on those signals 820, 822 and 824. According to one embodiment, the radio frequency input signal 824 comprises a signal as low as DC up to as high as at least 5 MHz.

In operation, the power amplifier 802 receives a radio frequency input signal 824 and generates a radio frequency output signal 826 based on the input signal 824. The output signal 826 is provided to the antenna 810 for transmission over the wireless interface. The power amplifier 802 operates based on the regulated power supply signal 820 generated by the power regulator 804.

In addition, the power amplifier 802 receives the bias signal 822 from the power regulator 804. The bias signal 822 allows the efficiency of the power amplifier 802 to be optimized based on operating conditions.

The power regulator 804 receives the input voltage 819 supplied by the power source 806. The power regulator 804 generates the regulated power supply signal 820 for the power amplifier 802 from the input voltage 819. According to one embodiment, the power regulator 804 optimizes the efficiency of the power amplifier 802 over a full range of output power levels for the output signal 826 by providing bias/supply control through the use of the regulated power supply signal 820 and the bias signal 822.

Although the present invention has been described with several embodiments, various changes and modifications may be suggested to one skilled in the art. It is intended that the present invention encompass such changes and modifications as fall within the scope of the appended claims.

What is claimed is:

1. A method for providing power management in a radio frequency power amplifier, comprising:
   receiving an input voltage;
   generating a first digital power supply signal;
   generating a second digital power supply signal; and
   generating from the input voltage both a first regulated power supply signal based on the first digital power supply signal and a second regulated power supply signal based on the second digital power supply signal.

2. The method of claim 1, further comprising:
   generating a digital bias signal; and
   generating a bias signal based on the digital bias signal.

3. The method of claim 2, further comprising providing the bias signal to the power amplifier.

4. The method of claim 3, further comprising:
   receiving at least the first regulated power supply signal and the bias signal at the power amplifier;
   receiving a radio frequency input signal at the power amplifier; and
   generating at the power amplifier a radio frequency output signal based on the regulated power supply signal, the bias signal, and the radio frequency input signal.

5. The method of claim 4, further comprising providing the radio frequency output signal to an antenna for transmission over a wireless interface.

6. The method of claim 1, wherein said receiving an input voltage further comprises receiving the input voltage from a power source, the power source comprising a battery.

7. A method for providing power management in a radio frequency power amplifier, the power amplifier comprising a plurality of operational amplifiers, the operational amplifiers comprising a set of operational amplifiers and a final operational amplifier, the method comprising:
   receiving an input voltage;
   generating a first digital power supply signal;
   generating a second digital power supply signal;
   generating from the input voltage a first regulated power supply signal based on the first digital power supply signal;
   generating from the input voltage a second regulated power supply signal based on the second digital power supply signal;
   providing the first regulated power supply signal to the set of operational amplifiers; and
   providing the second regulated power supply signal to the final operational amplifier.

8. The method of claim 7, further comprising:
   generating a first digital bias signal;
   generating a second digital bias signal;
   generating a first bias signal based on the first digital bias signal; and
   generating a second bias signal based on the second digital bias signal.

9. The method of claim 8, further comprising:
   providing the first bias signal to the set of operational amplifiers; and
   providing the second bias signal to the final operational amplifier.

10. The method of claim 9, further comprising:
    receiving the first and second regulated power supply signals and the first and second bias signals at the power amplifier;
    receiving a radio frequency input signal at the power amplifier; and
    generating at the power amplifier a radio frequency output signal based on the first and second regulated power supply signals, the first and second bias signals, and the radio frequency input signal.

11. A method for providing power management in a radio frequency power amplifier, comprising:
    receiving an input voltage;
    generating a first digital power supply signal;
    generating a second digital power supply signal;
    generating from the input voltage a first regulated power supply signal based on the first digital power supply signal;
    generating from the input voltage a second regulated power supply signal based on the second digital power supply signal;
    generating a third digital power supply signal;
    generating from the input voltage a third regulated power supply signal based on the third digital power supply signal;

generating a first digital bias signal;

generating a second digital bias signal;

generating a third digital bias signal;

generating a first bias signal based on the first digital bias signal;

generating a second bias signal based on the second digital bias signal; and generating a third bias signal based on the third digital bias signal.

12. The method of claim 11, the power amplifier comprising a first operational amplifier, a second operational amplifier, and a third operational amplifier, the operational amplifiers coupled to each other in series, the method further comprising:

providing the first regulated power supply signal and the first bias signal to the first operational amplifier;

providing the second regulated power supply signal and the second bias signal to the second operational amplifier;

providing the third regulated power supply signal and the third bias signal to the third operational amplifier;

receiving a radio frequency input signal at the first operational amplifier; and generating at the third operational amplifier a radio frequency output signal based on the first, second and third regulated power supply signals, the first, second and third bias signals, and the radio frequency input signal.

13. A system for providing power management in a radio frequency power amplifier, comprising:

a power amplifier operable to generate a radio frequency output signal based on a radio frequency input signal; and a power regulator coupled to the power amplifier, the power regulator operable to receive an input voltage, to generate a first digital power supply signal and a second digital power supply signal, to generate a digital bias signal, to generate from the input voltage both a first regulated power supply signal based on the first digital power supply signal and a second regulated power supply signal based on the second digital power supply signal, to generate a bias signal based on the digital bias signal, and to provide the first regulated power supply signal, the second regulated power supply signal and the bias signal to in the power amplifier; and the power amplifier further operable to generate the radio frequency output signal based on the first regulated power supply signal, the second regulated power supply signal and the bias signal.

14. The system of claim 13, the power amplifier comprising a plurality of operational amplifiers, wherein each of the operational amplifiers is operable to receive the regulated power supply signal and the bias signal.

15. A system for providing power management in a radio frequency power amplifier, comprising:

a power amplifier operable to generate a radio frequency output signal based on a radio frequency input signal; and a power regulator coupled to the power amplifier, the power regulator operable to receive an input voltage, to generate a digital power supply signal, to generate a digital bias signal, to generate from the input voltage a regulated power supply signal based on the digital power supply signal, to generate a bias signal based on the digital bias signal, and to provide the regulated power supply signal and the bias signal to the power amplifier;

wherein the power amplifier is further operable to generate the radio frequency output signal based on the regulated power supply signal and the bias signal;

wherein the power regulator comprises a baseband digital signal processor, a switcher coupled to the processor, and a digital-to-analog converter coupled to the processor;

wherein the processor is operable to generate the digital power supply signal;

wherein the switcher is operable to receive the input voltage and the digital power supply signal, to generate from the input voltage the regulated power supply signal based on the digital power supply signal, and to provide the regulated power supply signal to the power amplifier;

wherein at least one of the processor and the switcher is operable to generate the digital bias signal; and wherein the digital-to-analog converter is operable to receive the digital bias signal, to generate the bias signal based on the digital bias signal, and to provide the bias signal to the power amplifier.

16. The system of claim 13, further comprising a power source coupled to the power regulator, the power source operable to provide the input voltage, the power source comprising a battery.

17. The system of claim 13, further comprising an antenna coupled to the power amplifier, the antenna operable to receive the radio frequency output signal from the power amplifier and to transmit the radio frequency output signal over a wireless interface.

* * * * *

UNITED STATES PATENT AND TRADEMARK OFFICE
CERTIFICATE OF CORRECTION

| | | |
|---|---|---|
| PATENT NO. | : 6,900,697 B1 | Page 1 of 1 |
| APPLICATION NO. | : 10/160281 | |
| DATED | : May 31, 2005 | |
| INVENTOR(S) | : James T. Doyle, Dragan Maksimovic and Yushan Li | |

It is certified that error appears in the above-identified patent and that said Letters Patent is hereby corrected as shown below:

Column 11, line 28, delete "T he" and replace with --The--;

Column 12, line 48, delete "is" before the term "receive";

Column 14, line 57, delete "is" after the term "power".

Signed and Sealed this

Eighteenth Day of July, 2006

JON W. DUDAS
*Director of the United States Patent and Trademark Office*